(12) United States Patent
Zhang et al.

(10) Patent No.: US 10,157,832 B2
(45) Date of Patent: Dec. 18, 2018

(54) INTEGRATED CIRCUIT STRUCTURE INCLUDING VIA INTERCONNECT STRUCTURE ABUTTING LATERAL ENDS OF METAL LINES AND METHODS OF FORMING SAME

(71) Applicant: GLOBALFOUNDRIES INC., Grand Cayman (KY)

(72) Inventors: John H. Zhang, Altamont, NY (US); Carl J. Radens, LaGrangeville, NY (US); Lawrence A. Clevenger, Rhinebeck, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 12 days.

(21) Appl. No.: 15/453,133

(22) Filed: Mar. 8, 2017

(65) Prior Publication Data

US 2018/0261536 A1 Sep. 13, 2018

(51) Int. Cl.
*H01L 23/00* (2006.01)
*H01L 23/528* (2006.01)
*H01L 23/522* (2006.01)
*H01L 21/768* (2006.01)

(52) U.S. Cl.
CPC ...... *H01L 23/528* (2013.01); *H01L 21/76805* (2013.01); *H01L 21/76831* (2013.01); *H01L 21/76834* (2013.01); *H01L 21/76877* (2013.01); *H01L 23/5226* (2013.01)

(58) Field of Classification Search
CPC .................................................... H01L 23/528
See application file for complete search history.

(56) References Cited

U.S. PATENT DOCUMENTS

2004/0136169 A1* 7/2004 Morimoto .............. H05K 1/023
361/780
2010/0109164 A1* 5/2010 Kang ................ H01L 21/76898
257/774

\* cited by examiner

*Primary Examiner* — William Harriston
(74) *Attorney, Agent, or Firm* — Yuanmin Cai; Hoffman Warnick LLC (57) ABSTRACT

The disclosure is directed to an integrated circuit structure and methods of forming the same. The integrated circuit structure may include: a first metal level including a first metal line within a first dielectric layer; a second metal level including a second metal line in a second dielectric layer, the second metal level being over the first metal level; a first via interconnect structure extending through the first metal level and through the second metal level, wherein the first via interconnect structure abuts a first lateral of the first metal line and a first lateral end of the second metal line, and wherein the first via interconnect structure is a vertically uniform structure and includes a first metal.

17 Claims, 10 Drawing Sheets

INTEGRATED CIRCUIT STRUCTURE INCLUDING VIA INTERCONNECT STRUCTURE ABUTTING LATERAL ENDS OF METAL LINES AND METHODS OF FORMING SAME

BACKGROUND

Technical Field

The present disclosure relates to integrated circuit structures, and more particularly to an integrated circuit structure including a via interconnect structure abutting lateral ends of metal lines and methods of forming the same.

Related Art

Conventional semiconductor devices typically are made up of a semiconductor substrate, with a plurality of dielectric and conductive layers formed on it. Specifically, a plurality of dielectric layers may be formed on the substrate, one over the other, each including at least one metal line. Each dielectric layer including the at least one metal line may be known as a metal level. Conventional semiconductor devices are made up of many metal levels. The metal lines within the metal levels may be electrically connected to one another through via interconnect structures which run vertically within the semiconductor device.

Conventional via interconnect structures are formed by a damascene process. Specifically, after a first metal line is fabricated within a dielectric layer of a metal level, a trench or opening may be formed within the dielectric layer to expose an upper surface of the first metal line. The trench may be filled with an optional liner and a metal. The metal (and liner) may be planarized to a top surface of the dielectric layer. Subsequently, a second metal line may be formed over the metal and the dielectric layer such that the metal electrically connects the first and second metal lines. This process continues as desired after the formation of each metal line in each metal level to provide electrical connection between metal lines within the metal levels as desired. This damascene process is both timely and costly.

SUMMARY

A first aspect of the disclosure is directed to an integrated circuit structure. The integrated circuit structure may include: a first metal level including a first metal line within a first dielectric layer; a second metal level including a second metal line in a second dielectric layer, the second metal level being over the first metal level; a first via interconnect structure extending through the first metal level and through the second metal level, wherein the first via interconnect structure abuts a first lateral end of the first metal line and a first lateral end of the second metal line, and wherein the first via interconnect structure is a vertically uniform structure and includes a first metal.

A second aspect of the disclosure is directed to a method of forming an integrated circuit structure. The method may include: forming a plurality of vertically stacked metal levels, each metal level in the plurality of vertically stacked metal levels including at least one metal line within a dielectric layer; after the forming of the plurality of vertically stacked metal levels, forming a first via opening through the plurality of stacked metal levels wherein the first via opening exposes a first lateral end of a first metal line in a first metal level and a first lateral end of a second metal line in a second metal level; and filling at least a portion of the first via opening with a first metal such that the first metal abuts the first lateral end of the first metal line and the first lateral end of the second metal line.

A third aspect of the disclosure is directed to an integrated circuit structure. The integrated circuit structure may include: a first metal level including a first metal line within a first dielectric layer; a second metal level including a second metal line in a second dielectric layer, the second metal level being over the first metal level; a first via interconnect structure extending through the first metal level and through the second metal level, wherein the first via interconnect structure abuts an outer periphery of the first metal line and an outer periphery of the second metal line, and wherein the first via interconnect structure includes a first metal.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 5 shows a resulting integrated circuit structure according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to integrated circuit structures, and more particularly to an integrated circuit structure including a via interconnect structure abutting lateral ends of metal lines and methods of forming the same. In contrast to conventional via interconnect structures, the via interconnect structures of the present disclosure are formed after the formation of the desired number of metal levels, e.g., all of the metal levels in the integrated circuit structure. More specifically, instead of forming a via interconnect structure after the formation of each metal level, as is done in a damascene process, the present disclosure provides for via interconnect structures which are formed after a desired number of metal levels are formed. The via interconnect structures may laterally abut any or all of the desired metal lines within the metal levels for which electrical connection is to be provided. That is, in contrast to conventional via interconnect structures which contact a top surface (and/or a central portion) of the metal lines, the via interconnect structures of the present disclosure abut a lateral end or a sidewall of the metal lines, i.e., are entirely in contact with a surface about periphery of the metal lines. The via interconnect structures may be formed by etching a via opening to laterally abut at least one metal line in a metal level, and filling the via opening with a metal and/or an insulator to control the electrical connection between metal levels.

Figure 1:
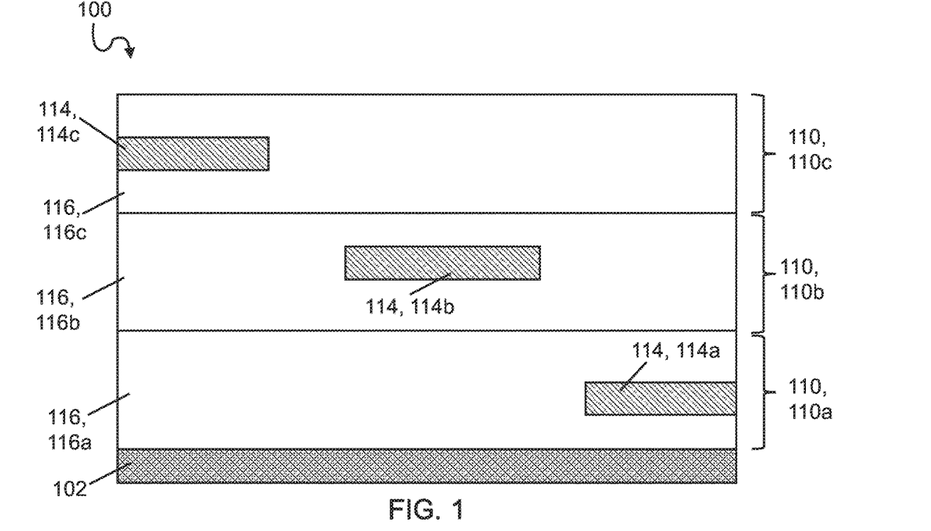
FIGS. 1-5 show cross-sectional views of an integrated circuit structure undergoing aspects of a method according to embodiments of the disclosure, where

FIG. 1 shows a preliminary integrated circuit (IC) structure 100 according to embodiments of the disclosure. IC structure 100 includes a substrate 102. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Overlying substrate 102 may be a plurality of vertically stacked metal levels 110. While not shown, it is to be understood that one or more device layers including conventional semiconductor devices such as transistors, resistors, etc. may be disposed between substrate 102 and the plurality of vertically stacked metal levels 110. As shown each metal level 110 may include at least one metal line 114 within a dielectric layer 116. More specifically, metal level 110a may include metal line 114a within dielectric layer 116a, metal level 110b may include metal line 114b within dielectric layer 116b, and metal level 110c may include metal line 114c within dielectric layer 116c. While only three metal levels 110 are shown in FIG. 1, it is to be understood that IC structure 100 may include any number of metal levels without departing from aspects of the disclosure. Metal lines 114 may each include a metal such as, for example, copper (Cu), tungsten (W), cobalt (Co), aluminum (Al), ruthenium (Ru), or combinations thereof. Metal lines 114 may each be composed of the same metal material, or in other embodiments, one or more metal lies 114 within IC structure 100 may include distinct metal materials from another metal line 114. In some embodiments, metal lines 114 may be separated from dielectric layers 116 by an optional liner layer (not shown). The optional liner layer may include, for example, tantalum (Ta), tantalum nitride (TaN), tantalum-aluminum nitride (TaAlN), tantalum silicide ($TaSi_2$), titanium (Ti), titanium nitride (TiN), titanium-silicon nitride (TiSiN), or tungsten (W). Dielectric layers 116 may include, for example, silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ), methyl silsesquioxane polymer (MSQ), SiLK™ (polyphenylene oligomer) manufactured by Dow Chemical, Midland, Mich.; Black Diamond™ [$SiOx(CH_3)_3$] manufactured by Applied Materials, Santa Clara, Calif.; fluorinated tetraethylorthosilicate (FTEOS), and fluorinated silicon glass (FSG). In an embodiment, dielectric layers 116 may comprise FSG or an organic material, for example, a polyimide.

Dielectric layers 116 may also each comprise multiple dielectric layers, for example, a first low-k (dielectric constant) layer and a second dielectric layer such as $Si_3N_4$ or $SiO_2$. The second dielectric layer may have a higher k dielectric constant value than the first low-k dielectric layer. Low-k dielectric layers include materials having a relative permittivity value of 3.9 or less, examples of which include but are not limited to HSQ, MSQ, SiLK™, Black Diamond™, FTEOS, and FSG.

IC structure 100 may be formed, for example, by forming the plurality of vertically stacked metal levels 110 over substrate 102 wherein each metal level 110 includes at least one metal line 114 within a dielectric layer 116. More specifically, by depositing dielectric layer 116a over substrate 102. "Depositing" or "deposition" as used herein, may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Metal line 114a may be formed within dielectric layer 116 by conventional photolithographic techniques. For example, an opening (not shown) may be formed, e.g., by etching, in dielectric layer 116. The opening may be optionally lined with the liner layer (not shown) and filled with the metal material of metal line 114. The liner layer and metal material may be planarized to a top surface of dielectric layer 116a and additional amounts of dielectric layer 116a may be formed thereover. This process may be repeated for each of the remaining metal levels 110, i.e., metal levels 110a, 110b. As shown in FIG. 1, metal lines 114 may be laterally offset from each other. That is, lateral ends of metal lines 114 may not be in lateral alignment. However, it is to be understood that IC structure 100 may include one or more metal lines 114 that are not laterally offset from each other or include lateral ends that are in lateral alignment.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

"Planarization" refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 2:
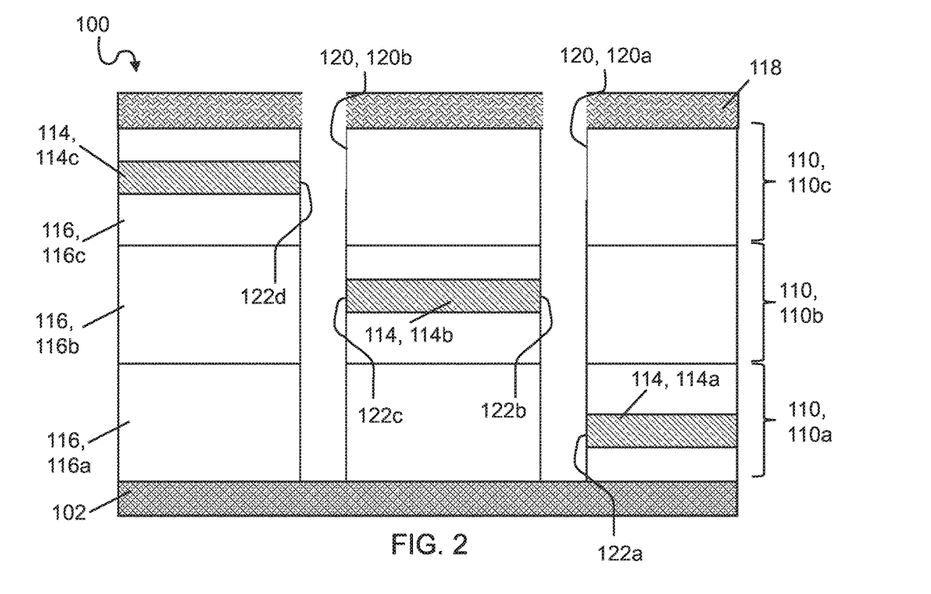

Turning now to FIG. 2, a mask 118 may be formed over IC structure 100. The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." Mask 118 may be patterned such that at least one via opening 120 (two shown) may be formed through the plurality of vertically stacked metal levels 110. More specifically, via opening 120a may be formed, e.g., by etching, such that via opening 120a abuts or exposes a lateral end 122a of metal line 114a within metal level 110a and a lateral end 122b of metal line 114b within metal level 110b. Further, via opening 120b may abut a lateral end 122c of metal line 114b that is on an opposing side of lateral end 122b of metal line 114b within metal level 110b and a lateral end 122d of metal line 114c within metal level 110c. Via openings 120 may include an opening such as a hole or a trench. In some embodiments, via openings 120 may have a critical dimension (width) of approximately 10 nanometers (nm) to approximately 500 nm. As used herein "approximately" is intended to include values, for example, within 10% of the stated values.

Figure 3:
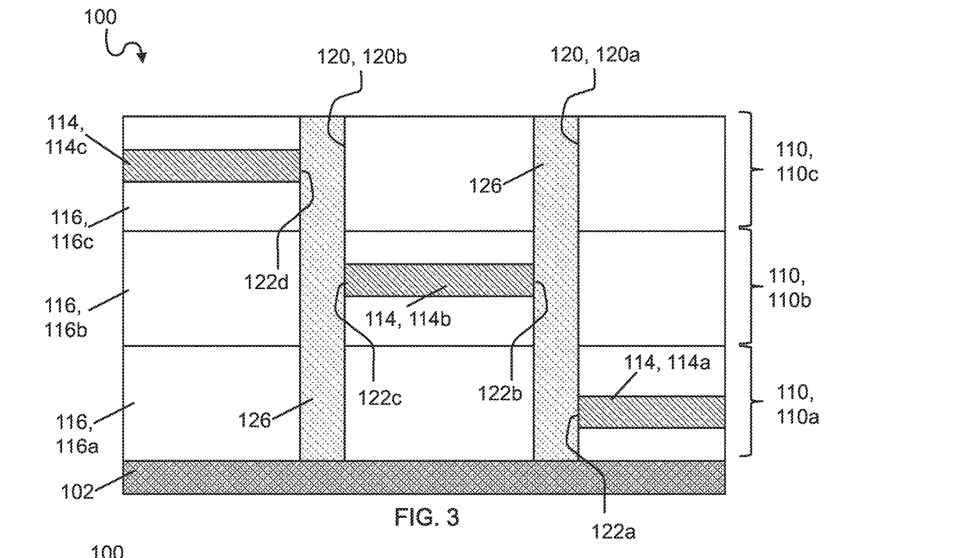
Figure 4:
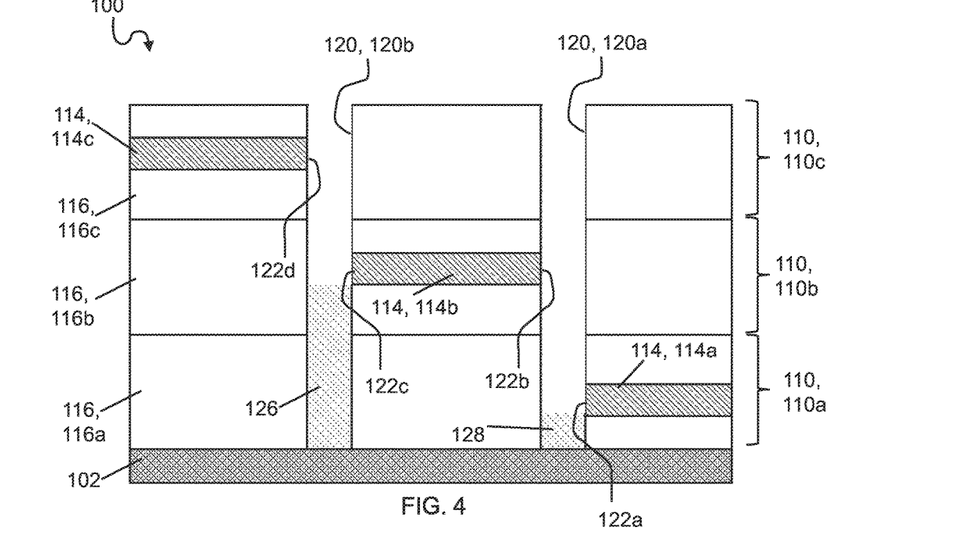

As shown in FIG. 3, mask 118 (FIG. 2) may be removed and via openings 120 may be filled with an insulator 126. More specifically, insulator 126 may be deposited within via openings 120 and planarized to a top surface of the plurality of vertically stack metal levels 110, i.e., the top surface of dielectric layer 116c. Insulator 126 may include, for example, any of the insulator or dielectric materials discussed herein, e.g., silicon dioxide. Turning to FIG. 4, insulator 126 may be recessed to expose lateral end 122a of metal line 114a and lateral end 122b of metal line 114 within opening 120a. Additionally, insulator 126 may be recessed to expose lateral end 122c of metal line 114b and lateral end 122d of metal line 114c within opening 120b, e.g., by etching. The recessing of insulator 126 may be performed with another mask (not shown) in place. Alternatively, insulator 126 may be deposited to a desired height at the outset such that lateral end 122a of metal line 114a and lateral end 122b of metal line 114b are exposed within opening 120a, and lateral end 122c of metal line 114b and lateral end 122d of metal line 114c are exposed within opening 120b. The formation of insulator 126 may also be performed with a mask in place to control the amount of insulator 126 that fills each opening 120.

Figure 5:
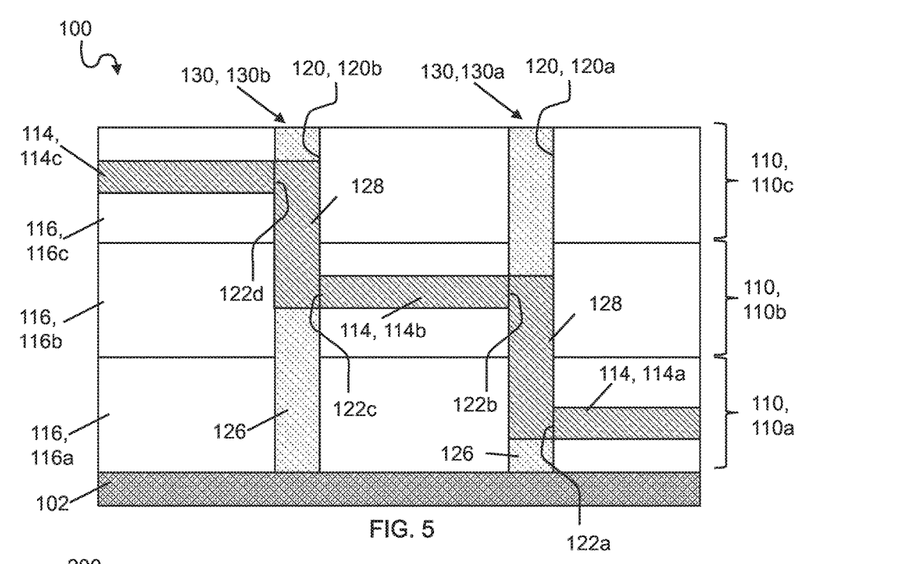

As shown in FIG. 5, at least a portion of via openings 120 may be filled with a metal 128. While not shown, it is to be understood that the metal, e.g., metal 128, used for the via interconnect structure structures herein according to the present disclosure may be at least partially surrounded by an optional liner layer. The liner layer may include any of the liner layer materials discussed herein. Metal 128 may include any of the metals discussed herein. In some embodiments, metal 128 may be composed of the same metal used for metal lines 114. In other embodiments, metal 128 may be composed of a metal that is distinct from the metal used for metal lines 114. In an even further embodiment, the metal selected for metal 128 used within via opening 120a may be distinct from the metal selected for metal 128 used within via opening 128b. In the embodiment shown, metal 128 may be formed, e.g., via deposition, over recessed insulator 126 within via openings 120 such that metal 128 abuts lateral end 122a of metal line 114a and lateral end 122b of metal lines 114a within via opening 120a. Further, metal 128 may be formed over recessed insulator 126 within openings 120 such that metal 128 abuts lateral end 122c of metal line 114b and lateral end 122d of metal line 114c. Metal 128 may be planarized to a top surface of the plurality of vertically stack metal levels 110, i.e., the top surface of dielectric layer 116c. Further, metal 128 may be recessed such that metal 128 extends from a position within via opening 120a that is approximately planar with a bottom surface of metal line 114a to a position that is approximately planar with a top surface of metal line 114b. Additionally, metal 128 may be recessed within via opening 120b such that metal 128 extends from a position within via opening 120b that is approximately planar with a bottom surface of metal line 114b to a position that is approximately planar with a top surface of metal line 114c. As a result, metal 128 abuts lateral end 122a of metal line 114a and lateral end 122b of metal line 114b within opening 120a. Metal 128 also abuts lateral end 122c of metal line 114b and lateral end 122d of metal line 114c within via opening 120b. Alternatively, metal 128 may be deposited to a desired height at the outset such that lateral end 122a of metal line 114a and lateral end 122b of metal line 114b are in contact with metal 128 within via opening 120a, and lateral end 122c of metal line 114b and lateral end 122d of metal line 114c are in contact with metal 128 within via opening 120b. The formation of metal 128 may also be performed with a mask in place to control the amount of metal 128 that fills each opening 120. Metal 128 provides electrical connection between metal line 114a and metal line 114b within via opening 120a, and provides electrical connection between metal line 114b and metal line 114c within via opening 120b.

A remaining portion of via opening 120a over metal 128 may be filled, e.g., by deposition and/or planarization, with additional amounts of insulator 126. That is, additional amounts of insulator 126 or another insulator 126 may be formed over metal 128 within via openings 120. As a result, via interconnect structure 130a is formed within opening 120a. A remaining portion of via opening 120b over metal 128 may be filled, e.g., by deposition and/or planarization, with additional amounts of insulator 126. As a result, via interconnect structure 130b is formed within opening 120b. Via interconnect structures 130a and 130b are each vertically uniform structures, e.g., a pillar extending vertically through metal levels 110. As should be clear from the discussion of FIGS. 1-5, the present disclosure provides for a method of forming via interconnect structure 130 at lateral ends 122a, 122b, 122c, 122d of metal lines 114. Via interconnect structure structures 130 disclosed herein may be formed within via openings 120 that are formed after the formation the plurality of vertically stacked metal levels 110. Via openings 120 may be selectively filled based on the desired connections that via interconnect structures 130 are to provide. Specifically, via openings 120 may be filled with both an insulator 128 and a metal 126 in order to customize the electrical connections that are desired between metal lines 114.

The resulting IC structure 100 shown in FIG. 5 may include metal level 110a including metal line 114a within dielectric layer 116a; metal level 110b over metal level 110a and including metal line 114b within dielectric layer 116b; and metal level 110c over metal level 110b and including metal line 114c within dielectric layer 116c. As show metal lines 114 may be laterally offset from one another. Via interconnect structures 130 may extend through metal level 110a, metal level 110b, and metal level 110c. Via interconnect structure 130a may abut lateral end 122a of metal line 114a and lateral end 122b of metal line 114b. Specifically, via interconnect structure 130a may include insulator 126 over substrate 102 and metal 128 over insulator 126 such that metal 128 abuts lateral ends 122a, 122b of metal lines 114a, 114b. Via interconnect structure 130a may also include additional amounts of insulator 126 or another insulator 126 over metal 128 extending to a top surface of dielectric layer 116c. Via interconnect structure 130b may abut lateral end 122c of metal line 114b (opposing lateral end 122b) and lateral end 122d of metal line 114c. Specifically, via interconnect structure 130b may include insulator 126 over substrate 102 and metal 128 over insulator 126 such that metal 128 abuts lateral ends 122c, 122d of metal lines 114b, 114c. Via interconnect structure 130b may also include additional amounts of insulator 126 or another insulator 126 over metal 128 extending to a top surface of dielectric layer 116c. Metal 128 within of via interconnect structure 130a may be distinct from or the same as metal 128 of via interconnect structure 130b. Additionally, one or more of the materials used for metal 128 within via interconnect structures 130 may be distinct from or the same as one or more of the materials used for metal lines 114.

In contrast to misalignment of conventional via interconnect structures which may occur and result in the conventional via interconnect structure contacting both a top surface and a portion of a lateral end or sidewall surface of the via interconnect structure, the present disclosure provides for via interconnect structures 130 which entirely contact a lateral end or sidewall surface about at least a portion of the periphery of metal lines 114.

Figure 6:
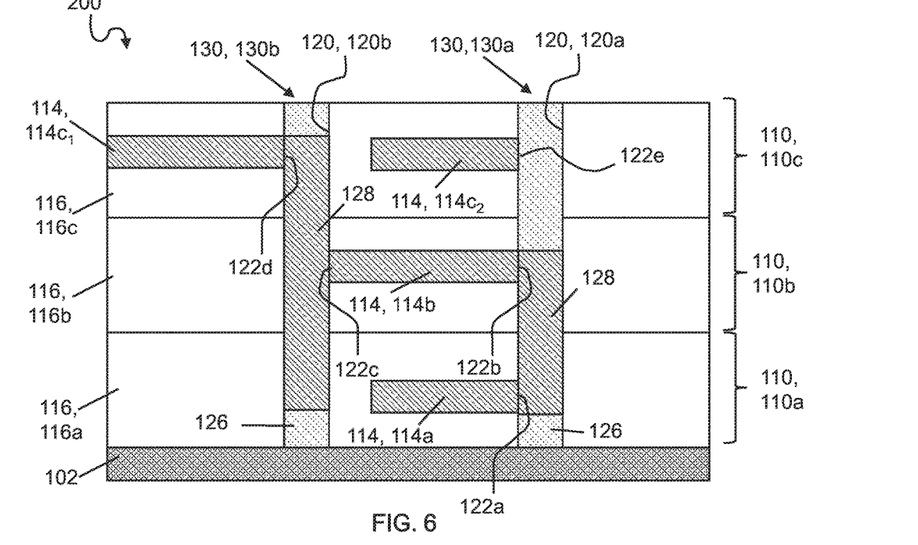
FIG. 6 shows another resulting integrated circuit structure according to embodiments of the disclosure.

FIG. 6 shows an IC structure 200 according to another embodiment of the disclosure. In this embodiment, metal level 110c includes two metal lines $114c_1$, $114c_2$. As in IC structure 100 (FIG. 5), metal line $114c_1$ is in electrical connection with metal line 114b through metal 128 within via opening 120b. However, metal line $114c_2$ is selectively isolated from electrical connection with any of the other metal lines 114 in IC structure 200 by insulator 126 (and dielectric layer 116c). That is, insulator 126 over metal 128 in via opening 120a abuts lateral end 122e of metal line $114c_2$ in metal level 110c. As also shown in FIG. 6, a larger portion of via opening 120a is filled with metal 128 than the portion within opening 120b of IC structure 100 that is filled with metal 128. Further, lateral end 122a of metal line 114a in metal level 110a is laterally aligned with lateral end 122b of metal line 114b in metal level 110b instead of laterally offset as it is with respect to IC structure 100 (FIG. 5). IC structure 200 may be formed in much of the same way as IC structure 100, however, the filling of via openings 120 may differ from that of IC structure 100 (FIG. 5) in order to create a larger portion filled with metal 128 in IC structure 200. Metal 128 within of via interconnect structure 130a may be distinct from or the same as metal 128 of via interconnect structure 130b. Additionally, one or more of the materials used for metal 128 within via interconnect structures 130 may be distinct from or the same as one or more of the materials used for metal lines 114.

Figure 7:
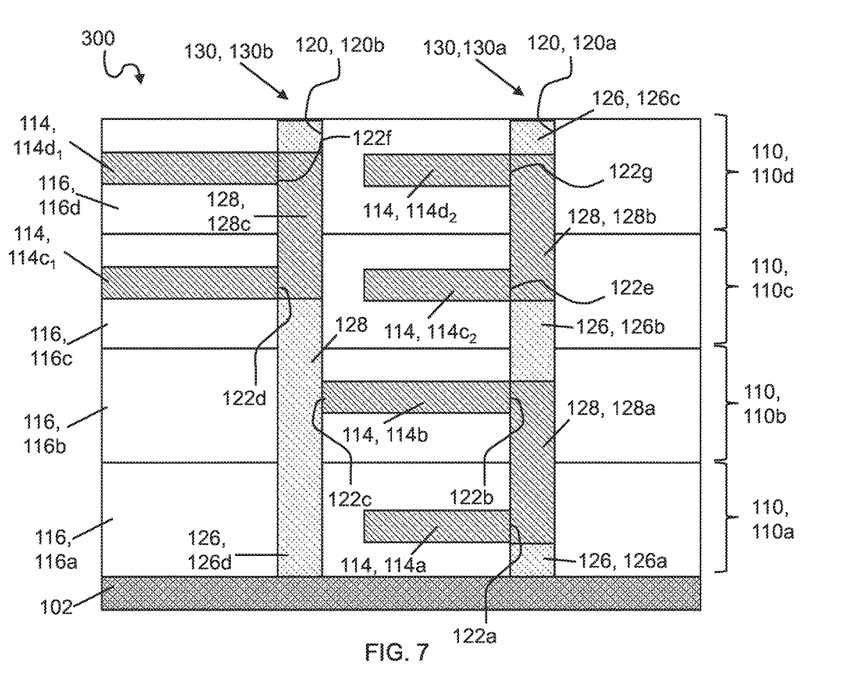
FIG. 7 shows another resulting integrated circuit structure according to embodiments of the disclosure.

FIG. 7 shows an IC structure 300 according to another embodiment of the disclosure. In this embodiment, IC structure 300 may include metal level 110a including metal line 114a within dielectric layer 116a; metal level 110b over metal level 110a and including metal line 114b within dielectric layer 116b; metal level 110c over metal level 110b and including metal lines $114c_1$, $110c_2$ within dielectric layer 116c; and metal level 110d over metal level 110c and including metal lines $114d_1$, $114d_2$ within dielectric layer 116d. As shown, one or more metal lines 114 may be laterally offset from one another, e.g., metal line 114a and metal line $114c_1$. Additionally, one or more metal lines 114 may include lateral ends in vertical alignment, e.g., lateral ends 122a, 122b, 122e. Via interconnect structures 130 may extend through metal level 110a, metal level 110b, metal level 110c, and metal level 110d. Via interconnect structure 130a may abut lateral ends 122a, 122b, 122e, 122g of metal lines 114a, 114b, $114c_2$, $114d_2$. Specifically, via interconnect structure 130a may include insulator 126a over substrate 102 and metal 128a over insulator 126a such that metal 128a abuts lateral ends 122a, 122b of metal lines 114a, 114b. Via interconnect structure 130a may also include additional amounts of insulator 126 or another insulator 126 over metal 128a extending from a top surface of metal 128a to a position within via opening 120a that is approximately planar with a bottom surface of metal line $114c_2$. Further, via interconnect structure 130a may include additional amounts of metal 128 or another metal 128b over insulator 126b such that metal 128b abuts lateral ends 122e, 122f of metal lines $114c_2$, $114d_2$. Metal 128b may be vertically aligned with metal 128a and insulators 126a, 126b within via interconnect structure 130a. In this way, insulator 126b is disposed between metals 128a, 128b. Via interconnect structure 130a may also include additional amounts of insulator 126 or another insulator 126c over metal 128b extending to a top surface of dielectric layer 116d. Metals 128a, 128b of via interconnect structure 130a may include the same or distinct material.

Via interconnect structure 130b may abut lateral end 122c of metal line 114b (opposing lateral end 122b) and lateral end 122d of metal line 114c. Specifically, via interconnect structure 130b may include insulator 126 over substrate 102 such that insulator 128c abuts lateral end 122c of metal line 114b. Via interconnect structure 130b may also include metal 128c over insulator 126d such that metal abuts lateral ends 122d, 122f of metal lines $114c_1$, $114d_1$. Additional amounts of insulator 126 or another insulator 126e may be disposed over metal 128c extending to a top surface of dielectric layer 116d. Metal 128c within of via interconnect structure 130b may be distinct from or the same as metals 128a, 128b of via interconnect structure 130a. Additionally, one or more of the materials used for metal 128 within via interconnect structures 130 may be distinct from or the same as one or more of the materials used for metal lines 114.

Figure 8:
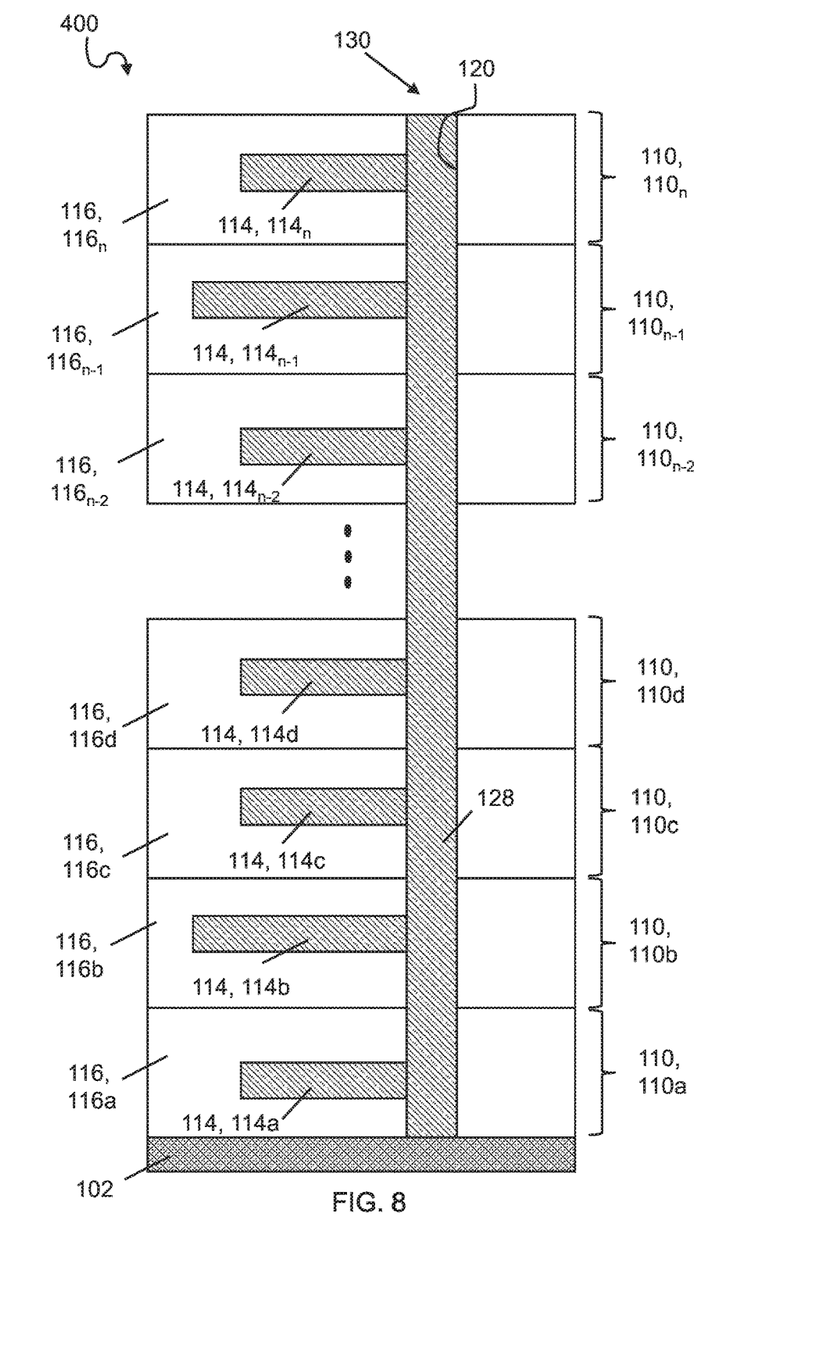
FIGS. 8-10 show cross-sectional views of illustrative integrated circuit structures according to embodiments of the disclosure.

Turning now to FIG. 8, another IC structure 400 is shown according to another embodiment of the disclosure. In this embodiment, IC structure 400 may include n number of metal levels 110. As in IC structures 100, 200 (FIGS. 5 and 6, respectively), each metal level 110 may include a metal line 114 disposed within a dielectric layer 116. In this embodiment, via opening 120 may be filled entirely with metal 128 to form via interconnect structure 130 such that via interconnect structure 130 extends throughout an entirety of each metal level 110 of the plurality of vertically stacked metal levels 110. In this way, via interconnect structure 130 provides electrical connection between all metal lines 114 which are laterally abutted by via interconnect structure 130.

This embodiment may be formed by forming via opening 120, e.g., etching, through the plurality of vertically stacked metal levels 110 such that via opening 120 abuts a lateral end (not individually labeled in FIG. 8) of each metal line 114. The forming of via opening 120 may take place after the formation of all of the plurality of vertically stacked metal levels 110 having metal lines 114 therein. Subsequently, via opening 120 may be filled, e.g., by deposition, with metal 128 such that metal 128 extends throughout an entirety of via opening 120 through each metal level 110 of the plurality of vertically stacked metal levels 110. Metal 128 may be optionally planarized to a top surface of dielectric layer 116n. Metal 128 may include the same material as at least one metal line 114 or may include a material that is a distinct from one or more metal lines 114. Further, one or more metal lines 114 within metal levels 110 may include the same or different material from one another metal line 114.

Figure 9:
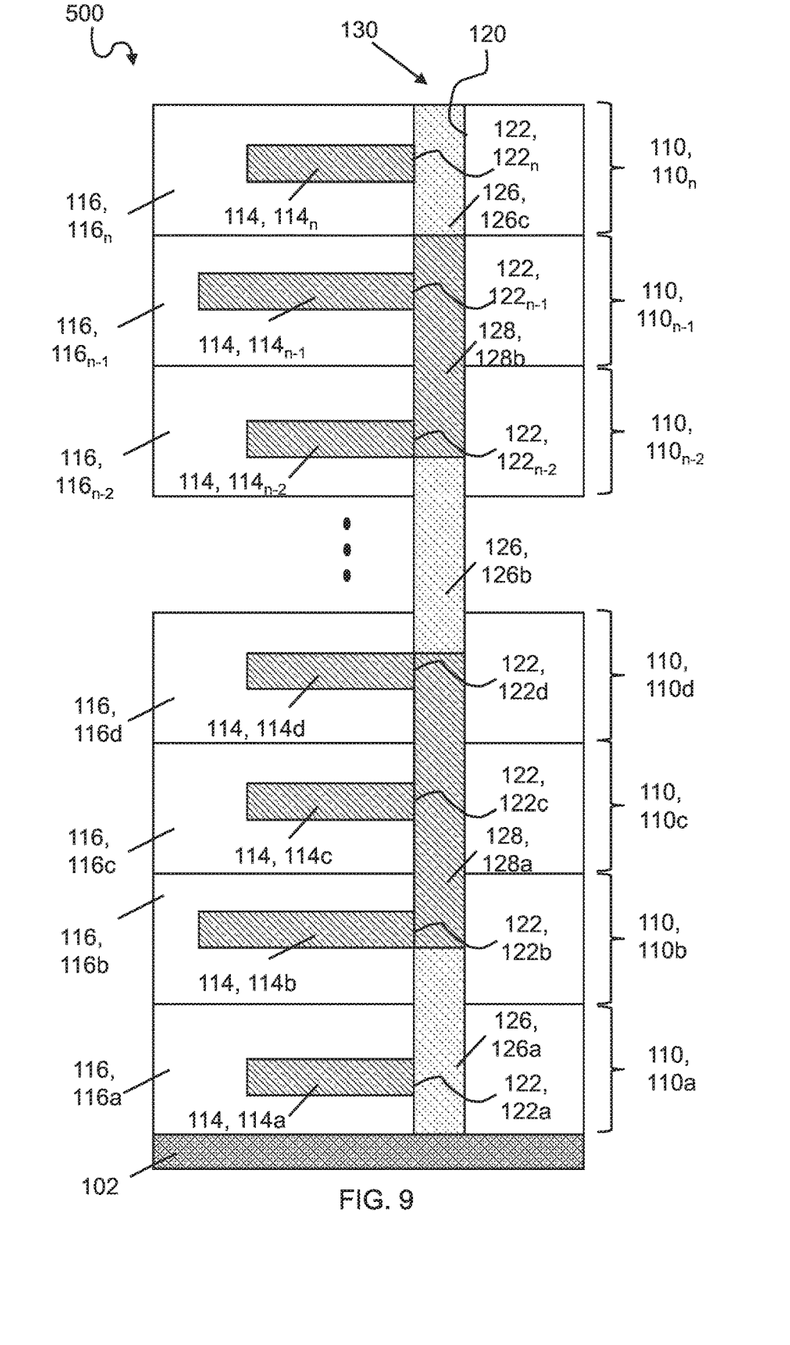

FIG. 9 shows another IC structure 500 according to embodiments of the disclosure. In this embodiment, IC structure 500 may include n number of metal levels 110. As in IC structures 100, 200 (FIGS. 5 and 6, respectively), each metal level 110 may include a metal line 114 disposed within a dielectric layer 116. In this embodiment, via opening 120 may be filled, e.g., by deposition, with both an insulator 126 and a metal 128 to form via interconnect structure 130. That is, via interconnect structure 130 may include insulator 126a over substrate 102 and abutting lateral end 122a of metal line 114a. Further, via interconnect structure 130 may include metal 128a disposed over insulator 126a within via opening 120 such that metal 128a abuts lateral ends 122b, 122c, 122d of metal lines 114b, 114c, 114d. Metal 128a provides electrical connection between metal lines 114b, 114c, 114d. Additionally, via interconnect structure 130 may include insulator 126b disposed over metal 128a within via opening 120 such that insulator 126b extends within metal levels between metal level 110d and metal level $110_{n-2}$ (not individually shown, but represented by dotted line). In such an embodiment, insulator 126b may or may not abut lateral ends of any metal line within metal levels between metal level 110d and metal level $110_{n-2}$. Another metal 128b may be disposed over insulator 126b within via opening 120 such that metal 128b abuts lateral ends $122_{n-2}$, $122_{n-1}$ of metal lines $114_{n-2}$, $114_{n-1}$. Metal 128b provides electrical connection between metal line $114_{n-2}$ and metal line $114_{n-1}$. Another insulator 126c may be disposed over metal 128b within via opening 120 such that insulator 126c abuts lateral end $122_n$ of metal line $114_n$ and such that insulator 126c is planar with a top surface of dielectric layer $116_n$. Insulators 126 (and respective dielectric layers 116) isolate metal lines 114a, 114n, and metal lines disposed between metal level 110d and metal level $110_{n-2}$.

This embodiment may be formed by forming via opening 120, e.g., etching, through the plurality of vertically stacked metal levels 110 such that via opening 120 abuts a lateral end of each metal line 114. The forming of via opening 120 may take place after the formation of the plurality of vertically stacked metal levels 110 having metal lines 114 therein. Subsequently, via opening 120 may be at least partially filled with insulator 126a over substrate 102 such that insulator 126a abuts lateral end 122a of metal line 114a in metal level 110a. After the formation of insulator 126a, via opening 120 may be at least partially filled with metal 128a such that metal 128a is disposed over insulator 126a in via opening 120 and abuts lateral ends 122b, 122c, 122d of metal lines 114b, 114c, 114d. After the formation of metal 128a, via opening 120 may be at least partially filled with insulator 126b such that insulator 126b is disposed over metal 128a in via opening 120 and extends within metal levels between metal level 110d and metal level $110_{n-2}$ (not individually shown, but represented by dotted line). In such an embodiment, insulator 126b may or may not abut lateral ends of any metal line within metal levels between metal level 110d and metal level $110_{n-2}$. Further, via opening 120 may be at least partially filled with metal 128b such that metal 128b is disposed over insulator 126b in via opening 120 and abuts lateral ends $122_{n-2}$, $122_{n-1}$ of metal lines $114_{n-2}$, $114_{n-1}$. Another insulator 126c may also be formed to at least partially fill via opening 120 such that insulator 126c is disposed over metal 128b in via opening 120 and abuts lateral end $122_n$ of metal line $114_n$. Insulator 126c may be planarized with a top surface of dielectric layer $116_n$. As discussed herein, the forming of insulators 126 and metals 128 can include filling via opening 120 with insulator 126 or metal 128, respectively, and etching or recessing (with a mask in place) the respective insulator 126 or metal to a desired height, or filling only a portion of via opening 120 with the respective insulator 126 or metal such that the respective insulator 126 or metal 128 has the desired height.

Figure 10:
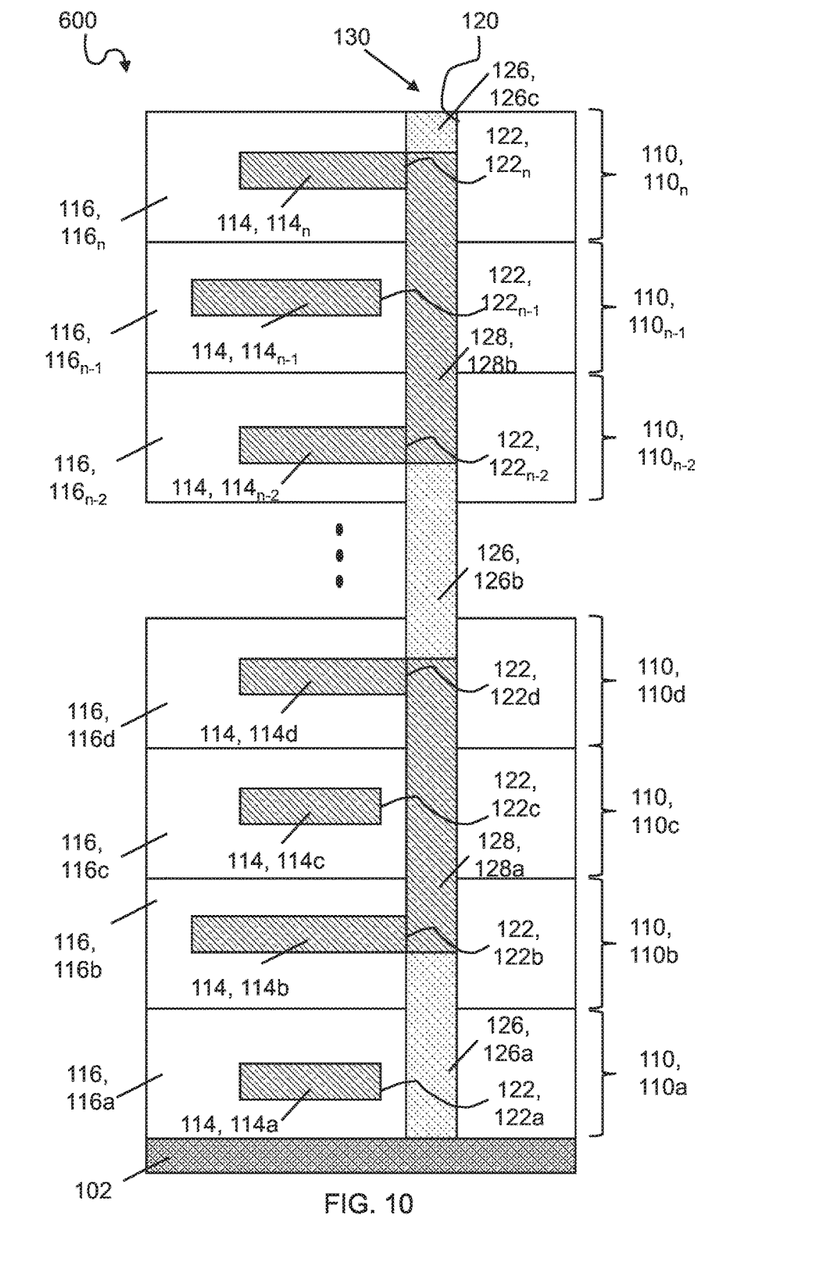

Turning now to FIG. 10, another IC structure 600 is shown according to another embodiment of the disclosure. In this embodiment, IC structure 600 may include n number of metal levels 110. As in IC structures 100, 200 (FIGS. 5 and 6, respectively), each metal level 110 may include a metal line 114 disposed within a dielectric layer 116. In this embodiment, via opening 120 may be filled, e.g., by deposition, with both insulator 126 and metal 128 to form via interconnect structure 130. That is, via interconnect structure 130 may include insulator 126a over substrate 102. However, in this embodiment, insulator 126a does not abut lateral end 122a of metal line 114a. Further, via interconnect structure 130 may include metal 128a disposed over insulator 126a within via opening 120 such that metal 128a abuts lateral ends 122b, 122d of metal lines 114b, 114d. However, in this embodiment, metal 128a does not abut lateral end 122c of metal line 114c. Therefore, metal 128a provides electrical connection between metal line 114b and metal line 114d, but metal line 114c is isolated from the two. Additionally, via interconnect structure 130 may include insulator 126b disposed over metal 128a within via opening 120 such that insulator 126b extends within metal levels between metal level 110d and metal level $110_{n-2}$ (not individually shown, but represented by dotted line). In such an embodiment, insulator 126b may or may not abut lateral ends of any metal line within metal levels between metal level 110d and metal level $110_{n-2}$. Another metal 128b may be disposed over insulator 126b within via openings 120 such that metal 128b abuts lateral ends $122_{n-2}$, $122_n$ of metal lines $114_{n-2}$, $114_n$. Metal 128b provides electrical connection between metal line $114_{n-2}$ and metal line $114_n$. However, in this embodiment, metal 128b does not abut lateral end $122_{n-1}$ of metal line $114_{n-1}$. Therefore, metal 128b provides electrical connection between metal line $114_{n-2}$ and metal line $114_n$, but metal line $114_{n-1}$ is isolated from the two. Another insulator 126c may be disposed over metal 128b within via opening 120 such that insulator 126c is planar with a top surface of dielectric layer $116_n$ of metal level $110_n$. Insulators 126 (and respective dielectric layers 116) isolate metal lines 114a, $114_n$, and metal lines disposed between metal level 110d and metal level $110_{n-2}$.

This embodiment may be formed by forming via opening 120, e.g., etching, through the plurality of vertically stacked metal levels 110 such that via opening 120 abuts a lateral end of desired metal lines 114. In this embodiment, via opening does not expose lateral ends 122a, 122c, $122_{n-1}$ of metal lines 114a, 114c, $114_{n-1}$. However, via opening exposes lateral ends 122b, 122d, $122_{n-2}$, $122_n$ of metal lines 114b, 114d, $114_{n-2}$, $114_n$. The forming of via opening 120 may take place after the formation of the plurality of vertically stacked metal levels 110 having metal lines 114 therein. Subsequently, via opening 120 may be at least partially filled with insulator 126a over substrate 102. As shown, insulator 126a does not abut lateral end 122a of metal line 114a in this embodiment. After the formation of insulator 126a, via opening 120 may be at least partially filled with metal 128a such that metal 128a is disposed over insulator 126a in via opening 120 and abuts lateral ends 122b, 122d of metal lines 114b, 114d. As shown, metal 128a does not abut lateral end 122c of metal line 114c. After the formation of metal 128a, via opening 120 may be at least partially filled with insulator 126b such that insulator 126b is disposed over metal 128a in via opening 120 and extends within metal levels between metal level 110d and metal level $110_{n-2}$ (not individually shown, but represented by dotted line). In such an embodiment, insulator 126b may or may not abut lateral ends of any metal line within metal levels between metal level 110d and metal level $110_{n-2}$. Further, via opening 120 may be at least partially filled with metal 128b such that metal 128b is disposed over insulator 126b in via opening 120 and abuts lateral ends $114_{n-2}$, $114_n$ of metal lines $114_{n-2}$, $114_n$. As shown, metal 128b does not abut lateral end $122_{n-1}$ of metal line $114_{n-1}$. Another insulator 126c may also be formed to at least partially fill via opening 120 such that insulator 126c is disposed over metal 128b in via opening 120 and abuts lateral end $122_n$ of metal line $114_n$. Insulator 126c may be planarized with a top surface of dielectric layer $116_n$. As discussed herein, the forming of insulators 126 and metals 128 can include filling via opening 120 with insulator 126 or metal 128, respectively, and etching or recessing (with a mask in place) the respective insulator 126 or metal to a desired height, or filling only a portion of via opening 120 with the respective insulator 126 or metal such that the respective insulator 126 or metal 128 has the desired height.

Figure 11:
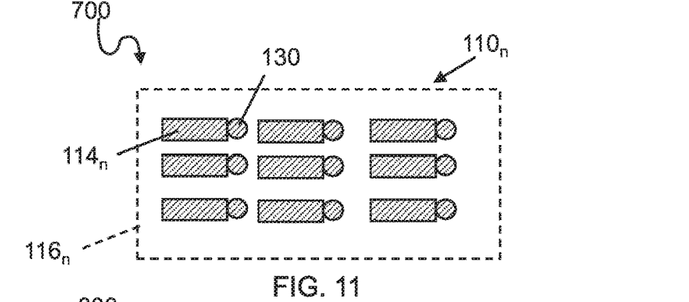
FIGS. 11-18 show top-down views of illustrative integrated circuit structures according to embodiments of the disclosure.

FIGS. 11-18 show top-down views of IC structures 700, 800, 900, 1000, 1100, 1200, 1300, 1400 according to embodiments of the disclosure wherein the upper most metal level $110_n$ includes metal lines $114_n$ within a dielectric layer $116_n$. Dielectric layer 116n is shown as dotted in order to show metal lines 114n therein. As shown, via interconnect structures 130 contact an outer (lateral) periphery of metal lines, i.e., metal lines 114n. Referring specifically to FIG. 11, metal level 110n may include a plurality of metal lines 114n within dielectric layer 116n. Additionally, metal level 110n may include a plurality of via interconnect structures 130, each abutting a lateral end (not individually labeled) of metal lines 114n. Via interconnect structures 130 may extend throughout an entirety of the metal levels 110 (not individually shown in FIG. 11, but under metal level 110n). Via interconnect structures 130 may be customized to provide customized connections between metal lines 114 within metal levels 110 such that via interconnect structures 130 may be selected to be filled with either a metal 128 (FIG. 10) and/or an insulator 126 (FIG. 10) to provide appropriate electrical connections.

Figure 12:
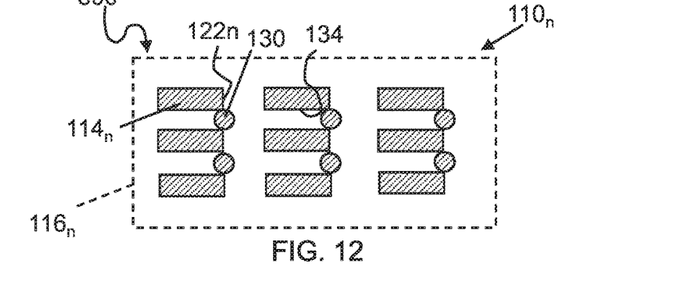
Figure 13:
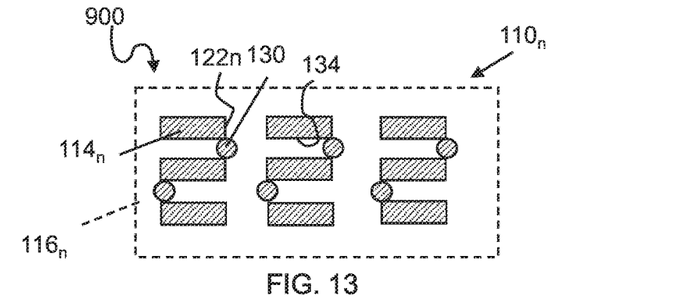
Figure 14:
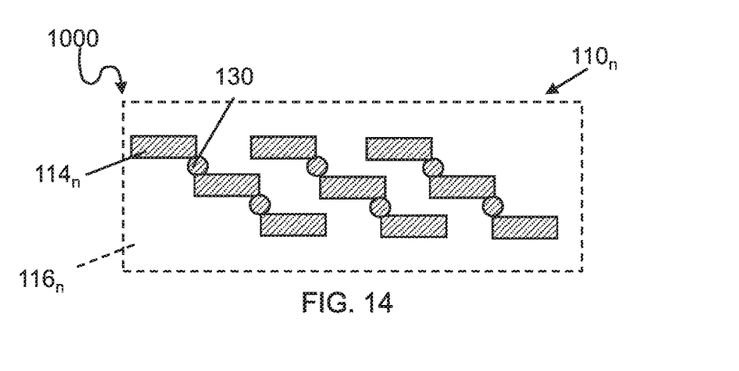

As shown in FIGS. 12-14, metal level 110n may include a plurality of metal lines 114n. Additionally, metal level 110n may include a plurality of via interconnects 130, each abutting an outer periphery at a lateral end 122n of at least one metal line 114n. Via interconnect structures 130 may extend throughout an entirety of the metal levels 110 (not individually shown in FIGS. 12-14, but under metal level 110n). In this embodiment, via interconnect structures 130 are electrically connected to two (adjacent) metal lines 114n within metal level 110n in addition to any desired metal line in any metal level below metal level 110n (not shown in FIGS. 12-14). As shown in FIG. 12, via interconnect structures 130 may each be disposed in contact with a sidewall 134 of metal lines 114n at a lateral end 122n of each metal line 114n. More specifically, FIG. 12 shows an embodiment where via interconnect structures 130 may be disposed at the same lateral end 122n (right side of metal line 114n according to FIG. 12) of metal lines 114n. FIG. 13 shows an embodiment where via interconnect structures 130 may be disposed at different lateral ends 122n (right side or left side of metal line 114n according to FIG. 13) of metal lines 114n. In contrast to FIGS. 12-13, which show embodiments where metal lines 114n within metal level 110n may be laterally aligned, FIG. 14 shows an embodiment where metal lines 114n within metal level 110n are not laterally aligned but may be staggered. In this embodiment, via interconnect structures 130 may be disposed at the same lateral end 122n (right side of metal line 114n according to FIG. 14) or metal lines 114n.

Figure 15:
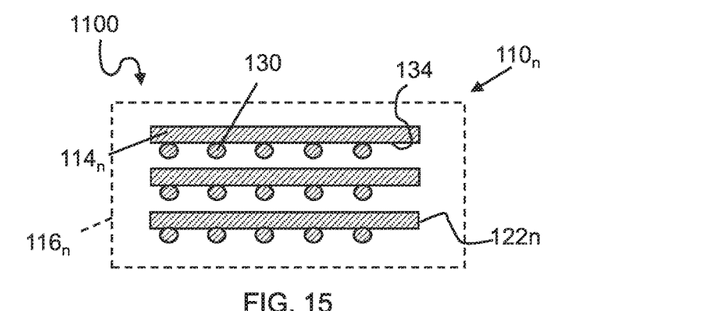
Figure 16:
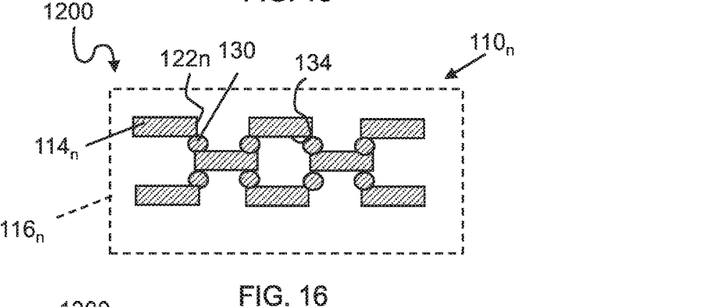

Turning now to FIG. 15, an IC structure 1100 is shown wherein via interconnect structures 130 may be alternatively disposed such that they abut a sidewall 134 of metal line 114n at a central portion of metal line 114n as opposed to lateral end 122n of metal line 114n. More specifically, via interconnect structure 130 abut at least a portion of an outer periphery of metal lines 114n. That is, in contrast to abutting lateral end 122n of metal line 110n, via interconnect structures 130 may be disposed such that they contact a sidewall of metal line 114n. Further, as shown in FIG. 16, IC structure 1200 may include via interconnect structures 130 which abut a sidewall 134 of metal lines 114n at a lateral end 122n of metal line 114n. Additionally, at least one metal line 114n may be staggered with respect to remaining metal lines 114n.

In any embodiment, via interconnect structures 130 may be customized to provide customized connections between metal lines 114 (FIG. 10) within metal levels 110 (FIG. 10) such that via interconnect structures 130 may be selected to be filled with either a metal 128 (FIG. 10) and/or an insulator 126 (FIG. 10) to provide appropriate electrical connections. For example, each via interconnect structure 130 may be fabricated such that one or more via interconnect structures 130 are composed of different materials and/or different combinations of materials to form desired connections between metal lines 114 in different metal levels 110.

Figure 17:
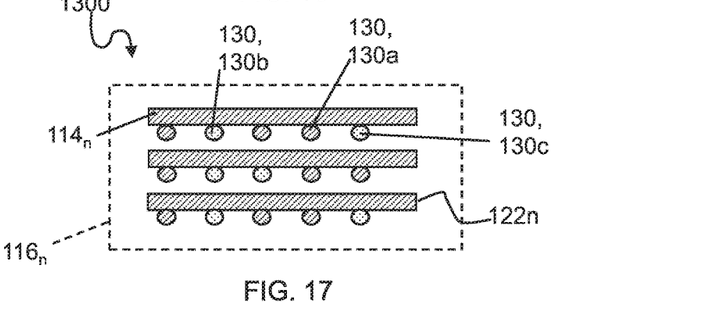
Figure 18:
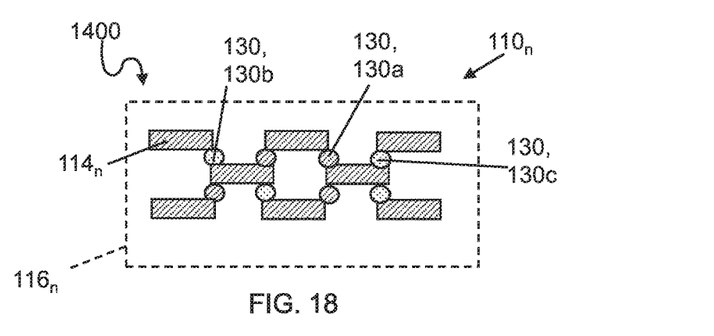

For example, FIGS. 17 and 18 show embodiments of the disclosure including three distinct via interconnect structures 130a, 130b, 130c which will be discussed herein relative to FIG. 19. FIG. 17 is similar to FIG. 15 in that IC structure 1300 may include via interconnect structures 130 disposed such that they abut sidewall 134 of metal line 114$_n$. FIG. 18 is similar to FIG. 16 in that IC structure 1400 may include via interconnect structures 130 such that they abut sidewall 134 of metal lines 114n at a lateral end 122n of metal line 114n and include at least one staggered meta line 114n.

Figure 19:
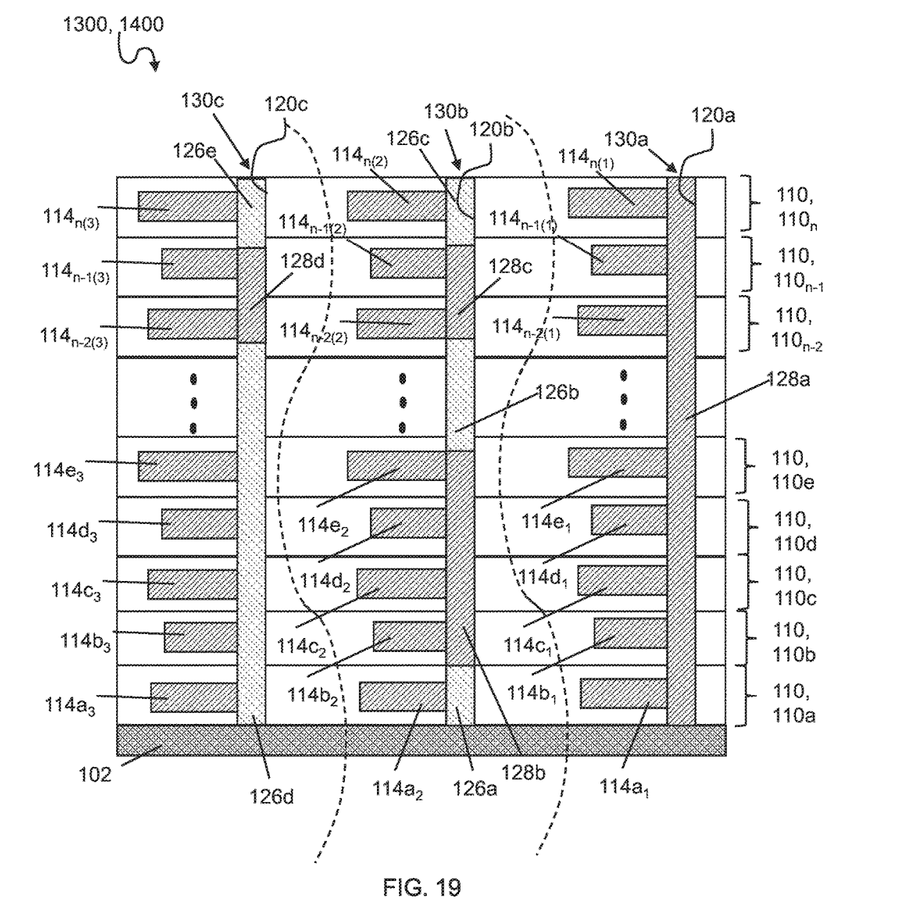
FIG. 19 shows a cross-sectional view of an illustrative integrated circuit structure of FIGS. 17-18.

FIG. 19 shows example compositions of via interconnect structures 130 of FIGS. 17-18. As shown, via interconnect structure 130a may include a metal 128a extending through via opening 120a throughout an entirety of each metal level 110 such that via interconnect structure 130a provides electrical connection between metal lines 114$a_1$, 114$b_1$, 114$c_1$, 114$d_1$, 114$e_1$, 114$_{n-2(1)}$, 114$_{n-1(1)}$, 114$_{n(1)}$. Additionally, via interconnect structure 130a may provide electrical connection between metal lines in metal levels (not shown in FIG. 19) that may be disposed between metal level 110e and metal level 110$_{n-2}$.

Via interconnect structure 130b may include an insulator 126a extending from substrate 102 through metal level 110a in via opening 120b and in contact with metal line 114$a_2$. Further, via interconnect structure 130b may include a metal 128b extending through metal levels 110b, 110c, 110d, 110e such that via interconnect structure 130 abuts a lateral end (not individually labeled) of metal lines 114$b_2$, 114$c_2$, 114$d_2$, 114$e_2$ such that metal 128b provides electrical connection therebetween. Additionally, another insulator 126b may be disposed over metal 128b. Insulator 126b may extend from an upper surface of metal 128b, e.g., within metal level 110e, to a bottom surface of metal line 114$_{n-2(2)}$, e.g., within metal level 110$_{n-2}$. As a result, metal lines within metal levels (not shown in FIG. 19) between metal level 110e and metal level 110$_{n-2}$ may be isolated from other metal lines, e.g., metal lines 114$b_2$, 114$c_2$, 114$d_2$, 114$e_2$, within IC structure 1200, 1300. Another metal 128c may be disposed over insulator 126b such that metal 128c abuts a lateral end (not individually labeled) of metal lines 114$_{n-2(2)}$, 114$_{n-1(2)}$. As a result, metal 128c may be provide electrical connection between metal line 114$_{n-2(2)}$ within metal level 110$_{n-2}$ and metal line 114$_{n-1(2)}$ within metal level 110$_{n-1}$. Additionally, via interconnect structure 130b may include another insulator 126c disposed above metal 128c and abutting a lateral end of metal line 114$_{n(2)}$ within metal level 110$_n$. As a result, metal line 114$_{n(2)}$ is isolated from other metal lines, e.g., metal lines 114$_{n-1(2)}$, 114$_{n-2(2)}$, within IC structure 1300, 1400.

Still referring to FIG. 19, via interconnect structure 130c may include an insulator 126d extending within via opening 120c from substrate 102 through metal levels 110a, 110b, 110c, 110d, 110e such that insulator 126d abuts lateral ends (not individually labeled) of metal lines 114$a_3$, 114$b_3$, 114$c_3$, 114$d_3$, 114$e_3$. Additionally, insulator 126d may extend through metal levels (not shown in FIG. 19) between metal level 110e and metal level 110$_{n-2}$ such that the metal lines within metal levels between metal level 110e and metal level 110$_{n-2}$ may be isolated from other metal lines, e.g., metal lines 114$_{n-2(3)}$, 114$_{n-1(3)}$, within IC structure 1300, 1400. Further, a metal 128d may be disposed over insulator 126d such that metal 128d abuts a lateral end (not individually labeled) of metal lines 114$_{n-2(3)}$, 114$_{n-1(3)}$. As a result, metal 128d provided electrical connection between metal line 114$_{n-2(3)}$ within metal level 110$_{n-2}$ and metal line 114$_{n-1(3)}$ within metal level 110$_{n-1}$. Another insulator 126e may be formed over metal 128d such that insulator 126e abuts a lateral end (not individually labeled) of metal line 114$_{n(3)}$ within metal level 110$_n$. As a result, metal line 114$_{n(3)}$ is isolated from other metal lines, e.g., metal lines 114$_{n-1(3)}$, 114$_{n-2(3)}$, within IC structure 1300, 1400.

IC structures 1300, 1400 (FIGS. 17-49) can be formed by forming the plurality of vertically stacked metal levels 110 including metal lines 114 within dielectric layers 116, e.g., by conventional photolithography techniques. Subsequently, a plurality of via openings 120a, 120b, 120c (FIG. 19) can be formed, e.g., by etching with a mask in place, such that via openings 120a, 120b, 120c selectively laterally abut any desired metal lines 114 within metal levels 110. Further, via openings 120a, 120b, 120c can be filled, e.g., by deposition with a mask in place, with a metal, e.g., metal 128a, and/or an insulator, e.g., insulator 126a, to form via interconnect structures 130a, 130b, 130c. By using and patterning a mask, an IC fabricator can selectively form via openings in desired locations and selectively fill via openings to form via interconnect structures based on the electrical connections that the fabricator intends to create. As a result, the method(s) and structure presented herein allow for a cost effective, simplified way to control electrical connections between metal levels of an IC structure when compared to conventional IC structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the invention.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit structure comprising:
   a semiconductor substrate;
   a first metal level formed on the semiconductor substrate including a first metal line within a first dielectric layer;
   a second metal level including a second metal line in a second dielectric layer, the second metal level being over the first metal level;
   a third metal level including a third metal line within a third dielectric layer, the third metal level being over the second metal level;
   a first via interconnect structure extending through the first metal level and through the second metal level, wherein the first via interconnect structure abuts a first lateral end of the first metal line and a first lateral end of the second metal line, and wherein the first via interconnect structure is a vertically uniform structure and includes a first metal; and
   a first insulator disposed over the first metal of the first via interconnect structure such that the first insulator abuts a first lateral end of the third metal line.

2. The integrated circuit structure of claim 1, further comprising:
   a fourth metal level including a fourth metal line within a fourth dielectric layer, the fourth metal level being over the third metal level; and
   a second via interconnect structure extending through the third metal level and through the fourth metal level, wherein the second via interconnect structure abuts a first lateral end of the third metal line and a first lateral end of the fourth metal line, the second via interconnect structure being vertically aligned with the first via interconnect structure and including a second metal.

3. The integrated circuit structure of claim 2, wherein the second metal is distinct from the first metal.

4. The integrated circuit structure of claim 3, further comprising:
   an insulator disposed between the first metal and the second metal.

5. The integrated circuit structure of claim 1, further comprising:
   a second via interconnect structure extending through the third metal level and the second metal level, the second via interconnect structure abutting a second, opposing lateral end of the second metal line and abutting a first lateral end of the third metal line and the second via interconnect structure including a second metal.

6. The integrated circuit structure of claim 5, wherein the second metal is of a distinct composition from the first metal.

7. A method of forming an integrated circuit structure, the method comprising:
   forming a plurality of vertically stacked metal levels on a semiconductor substrate, each metal level in the plurality of vertically stacked metal levels including at least one metal line within a dielectric layer;
   after the forming of the plurality of vertically stacked metal levels, forming a first via opening through the plurality of stacked metal levels wherein the first via opening exposes a first lateral end of a first metal line in a first metal level and a first lateral end of a second metal line in a second metal level;
   filling the first via opening with a first insulator up to a height below the first lateral ends of the first metal line and the second metal line;
   filling at least a portion of the first via opening over the first insulator with a first metal such that the first metal abuts the first lateral end of the first metal line and the first lateral end of the second metal line.

8. The method of claim 7, wherein the filling of the at least the portion of the first via opening further includes:
   forming a second insulator over the first metal within the first via opening.

9. The method of claim 8, wherein the filling of the at least the portion of the first via opening further includes:
   forming a second metal over the second insulator within the first via opening, wherein the second metal abuts a first lateral end of a third metal line in a third metal level and a first lateral end of the fourth metal line in a fourth metal level, wherein the third metal level is over the second metal level and the fourth metal level is over the third metal level.

10. The method of claim 9, wherein the second metal is distinct from the first metal.

11. The method of claim 7, wherein the filling of the at least the portion of the first via opening includes:
    forming a second insulator over the first metal within the first via opening.

12. The method of claim 11, wherein the filling of the at least the portion of the first via opening further includes:
    forming a second metal over the second insulator within the first via opening, wherein the second metal abuts a first lateral end of a third metal line in a third metal level and a first lateral end of a fourth metal line in a fourth metal level, wherein the third metal level is over the second metal level and the fourth metal level is over the third metal level.

13. The method of claim 7, further comprising:
    forming a second via opening extending through the plurality of vertically stacked metal levels wherein the second via opening abuts a first lateral end of a third metal line in a third metal level, the third metal level over the second metal level, and wherein the second via opening abuts a second, opposing lateral end of the second metal line; and
    filling at least a portion of the second via opening with a second metal such that the second metal abuts the first lateral end of a third metal line and the second lateral end of the second metal line.

14. The method of claim 13, wherein the second metal is distinct from the first metal.

15. The method of claim 7, wherein the filling of the at least a portion of the first via opening further includes:
forming the first metal such that the first metal extends throughout an entirety of the first via opening through each of the metal levels of the plurality of vertically stacked metal levels.

16. An integrated circuit structure comprising:
a semiconductor substrate;
a first metal level formed on the semiconductor substrate including a first metal line within a first dielectric layer;
a second metal level including a second metal line in a second dielectric layer, the second metal level being over the first metal level;
a first via interconnect structure extending through the first metal level and through the second metal level, wherein the first via interconnect structure abuts an outer periphery of the first metal line and an outer periphery of the second metal line, and wherein the first via interconnect structure includes a first metal;
a third metal level including a third metal line within a third dielectric layer, the third metal level being over the second metal level;
a fourth metal level including a fourth metal line within a fourth dielectric layer, the fourth metal level being over the third metal level; and
a second via interconnect structure extending through the third metal level and through the fourth metal level, wherein the second via interconnect structure abuts an outer periphery of the third metal line and an outer periphery of the fourth metal line, the second via interconnect structure being over the first via interconnect structure and including a second metal.

17. The integrated circuit structure of claim 16, wherein the second metal is distinct from the first metal.

* * * * *